United States Patent
Okahisa

(10) Patent No.: US 9,748,733 B2
(45) Date of Patent: Aug. 29, 2017

(54) SEMICONDUCTOR LASER DEVICE AND BACKLIGHT DEVICE USING THE SEMICONDUCTOR LASER DEVICE

(71) Applicant: NICHIA CORPORATION, Anan-shi, Tokushima (JP)

(72) Inventor: Eiichiro Okahisa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 20 days.

(21) Appl. No.: 15/081,284

(22) Filed: Mar. 25, 2016

(65) Prior Publication Data
US 2016/0285234 A1  Sep. 29, 2016

(30) Foreign Application Priority Data

Mar. 26, 2015 (JP) ................. 2015-064576
Mar. 18, 2016 (JP) ................. 2016-056087

(51) Int. Cl.
| | |
|---|---|
| *F21V 7/04* | (2006.01) |
| *H01S 5/022* | (2006.01) |
| *F21V 8/00* | (2006.01) |
| *G02B 6/42* | (2006.01) |

(52) U.S. Cl.
CPC ........ *H01S 5/02292* (2013.01); *G02B 6/0066* (2013.01); *G02B 6/4214* (2013.01); *H01S 5/02208* (2013.01)

(58) Field of Classification Search
CPC .......... H01S 5/02292; H01S 5/502208; G02B 6/0066; G02B 6/4214
USPC ................. 362/611, 612, 632, 609
See application file for complete search history.

(56) References Cited

U.S. PATENT DOCUMENTS

| | | | |
|---|---|---|---|
| 5,100,220 A | 3/1992 | Voegeli | |
| 5,600,741 A * | 2/1997 | Hauer | ................. G02B 6/4204 385/14 |
| 6,487,224 B1 | 11/2002 | Ohashi et al. | |
| 2005/0019037 A1 | 1/2005 | Luo et al. | |
| 2006/0018351 A1 | 1/2006 | Matsubara et al. | |
| 2012/0039072 A1 | 2/2012 | Lell et al. | |

(Continued)

FOREIGN PATENT DOCUMENTS

| | | |
|---|---|---|
| JP | H04-218992 A | 8/1992 |
| JP | 2000-114655 A | 4/2000 |
| JP | 2001-217500 A | 8/2001 |

(Continued)

OTHER PUBLICATIONS

Office Action issued in Japanese Patent Application No. 2016-056087 dated Jan. 12, 2017.

*Primary Examiner* — Vip Patel
(74) *Attorney, Agent, or Firm* — Foley & Lardner LLP

(57) ABSTRACT

The semiconductor laser device includes a base member having a recess that opens upward, a semiconductor laser element disposed on a bottom surface of the recess, and a light reflecting member being disposed forward of a light emitting surface of the semiconductor laser element and including a light reflecting surface to reflect laser light emitted from the semiconductor laser element. The semiconductor laser element and the light reflecting member are arranged such that a direction of an optical axis of light that is reflected by the light reflecting member is different from a direction that is perpendicular to a lower surface of the base member.

20 Claims, 7 Drawing Sheets

(56) References Cited

U.S. PATENT DOCUMENTS

2015/0177443 A1    6/2015    Faecke et al.

FOREIGN PATENT DOCUMENTS

| | | |
|---|---|---|
| JP | 2001-298236 A | 10/2001 |
| JP | 2006-040933 A | 2/2006 |
| JP | 2007-141596 A | 6/2007 |
| JP | 2011-181794 A | 9/2011 |
| JP | 2012-512508 A | 5/2012 |
| JP | 2014-524043 A | 9/2014 |
| WO | WO-2012/174364 A2 | 12/2012 |
| WO | WO-2014/026917 A1 | 2/2014 |

* cited by examiner

SEMICONDUCTOR LASER DEVICE AND BACKLIGHT DEVICE USING THE SEMICONDUCTOR LASER DEVICE

CROSS-REFERENCE TO RELATED APPLICATIONS

This application claims priority to Japanese Patent Application No. 2015-064576 filed on Mar. 26, 2015, and Japanese Patent Application No. 2016-056087 filed on Mar. 18, 2016. The entire disclosure of Japanese Patent Application No. 2015-064576 and Japanese Patent Application No. 2016-056087 are hereby incorporated herein by reference.

BACKGROUND

The present disclosure relates to a semiconductor laser device and a backlight device using the semiconductor laser device.

In recent years, development of a backlight device for a thin liquid crystal display device with ultra-high definition has been required. In order to achieve a wide color gamut of the display device, a backlight device equipped with a semiconductor laser has been studied. For example, a light emitting device described in JP 2011-181794A is configured such that an edge-emission type light emitting element having an optical waveguide formed on a surface of semiconductor layered structure is reflected by a convex reflective surface of a reflective member in a direction perpendicular to a direction of the emitted light. (For example, see FIG. 2, FIG. 5, and FIG. 6 of JP 2011-181794A).

SUMMARY

However, laser light has high directivity, so that in the case where a conventional light emitting device to emit laser light in a perpendicular direction with respect to its emission surface, the light emitting device is used in combination with a light guide plate, it may be difficult to irradiate laser light on a portion of a light reflective surface of the light guide plate that is in the vicinity of a light incident surface of the light guide plate. For this reason, with the conventional light emitting device, luminance of a light emitting surface of the light guide plate may not be uniform.

The present disclosure is devised in light of the disadvantages described above, and is aimed to provide a semiconductor laser device that can emit light in a desired direction and a backlight device using the semiconductor laser device.

A semiconductor laser device according to certain embodiments of the present invention includes a base member having a recess that opens upward, a semiconductor laser element disposed on a bottom surface of the recess, and a light reflecting member disposed on the bottom surface of the recess and configured to reflect laser light emitted from the semiconductor laser element. In particular, the semiconductor laser element and the light reflecting member are arranged so that a direction of an optical axis of light that is reflected by the light reflecting member differs from a direction that is perpendicular to a lower surface of the base member.

Also, a backlight device according to certain embodiments of the present invention includes the semiconductor laser device and a light guide plate that is disposed above the base member of the semiconductor laser device.

With the semiconductor laser device described above, light emitted from the semiconductor laser device can be emitted in a desired direction.

Also, with the backlight device described above, the direction of light emitted from the semiconductor laser device can be inclined with respect to a direction perpendicular to the light emitting surface of the semiconductor laser device, so that laser light can be incident on a portion of a light reflecting surface of the light guide plate that is in the vicinity of a light incident surface of the light guide plate.

DETAILED DESCRIPTION OF EMBODIMENTS

Embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same

First Embodiment

Figure 1:
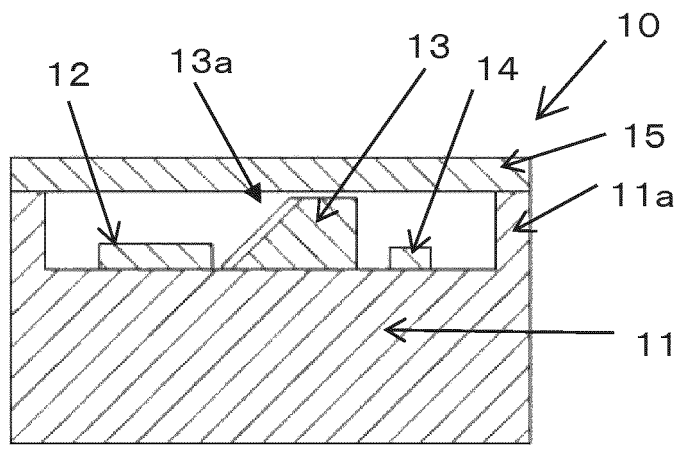
FIG. 1 is a schematic cross-sectional view of a semiconductor laser device according to a first embodiment.
Figure 2:
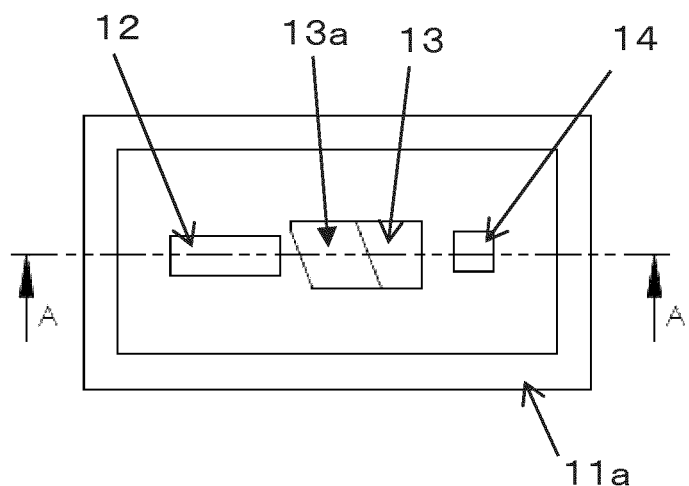
FIG. 2 is a schematic plan view of the semiconductor laser device shown in FIG. 1 seen from the light emitting surface side.
Figure 3:
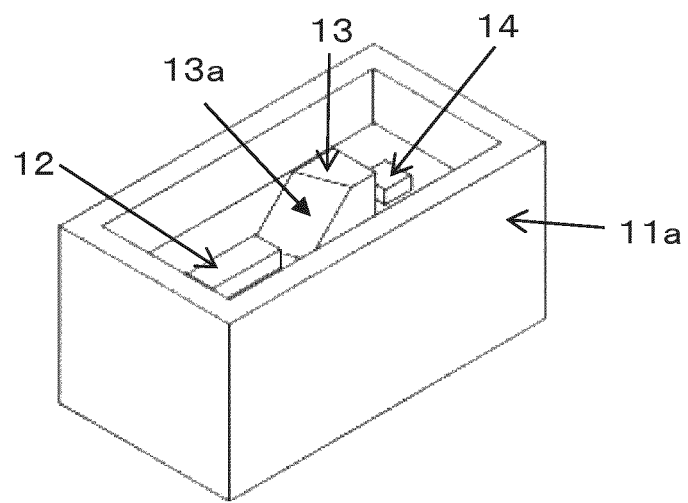
FIG. 3 is a schematic perspective view of the semiconductor laser device shown in FIG. 1.

FIG. 1 to FIG. 3 illustrate a semiconductor laser device 10 according to the present embodiment. FIG. 1 is a schematic cross-sectional view of a semiconductor laser device 10 (a schematic cross-sectional view taken along line A-A of FIG. 2), FIG. 2 is a schematic plan view of the semiconductor laser device 10 seen from an upper surface side (the light emitting surface side) thereof, and FIG. 3 is a schematic perspective view of the semiconductor laser device 10. In FIG. 2 and FIG. 3, a light transmissive member 15 is not shown for easy understanding of the structure.

The semiconductor laser device 10 includes a base member 11 having a recess that opens upward, a semiconductor laser element 12 disposed on a bottom surface of the recess, and a light reflecting member 13 disposed on a bottom surface of the recess and configured to reflect laser light emitted from the semiconductor laser element 12. In particular, the semiconductor laser element 12 and the light reflecting member 13 are arranged such that a direction of an optical axis of light that is reflected by the light reflecting member (that is, an optical axis of a light reflected by the light reflecting surface 13a) differs from a direction that is perpendicular to a lower surface of the base member.

With the semiconductor laser device 10, an optical axis of light reflected by the light reflecting member 13 can be inclined in a direction different from a direction that is perpendicular to the light emitting surface of the semiconductor laser device 10. That is, the direction of the optical axis of light reflected by the light reflecting member 13 is upward but not perpendicular to the lower surface of the base member 11. With this arrangement, in the case of using the semiconductor laser device in combination with a light guide plate 52, laser light can be incident on a portion of a light reflecting surface of the light guide plate 52 in the vicinity of an incident surface of the light guide plate 52. Accordingly, more uniform luminance can be obtained on a light extracting surface of the light guide plate 52.

Conventionally, a light reflecting surface of a light reflecting member is arranged so that light emitted from a semiconductor laser element is reflected in a perpendicular direction, that is, an optical axis of reflected light that is reflected on the light reflecting surface is aligned with a direction perpendicular to the light emitting surface of the semiconductor laser device (a direction perpendicular to the lower surface of the base member 11). Further, a light guide plate is arranged perpendicularly to the light emitting surface of the semiconductor laser device. While light from LED spreads or diffuses to a certain degree, laser light has a high directivity, so that light emitted from a semiconductor laser device may hardly be irradiated onto a portion of a light reflecting surface of the light guide plate that is in the vicinity of a light incident surface of the light guide plate. As an improvement, the semiconductor laser device may be mounted with an inclination with respect to the light guide plate so as to irradiate light onto the light reflecting surface of the light guide plate. However, in this case, the semiconductor laser device must be mounted while adjusting the direction of light emitted from the semiconductor laser device with respect to the light guide plate, which causes difficulty in mounting the semiconductor laser device.

In the present embodiment, the light reflecting surface 13a faces in a predetermined direction so as to allow emission of light reflected by the light reflecting member 13 (i.e. light emitted from the semiconductor laser device 10) to emit in a direction other than a direction that is perpendicular to the light emitting surface of the semiconductor laser device. That is, in the present embodiment, the base member 11 has a substantially rectangular outer shape that elongates in a direction when the base member 11 is seen from above. Further, when the semiconductor laser device 10 is seen in a direction of from a lateral side that is a short side of the rectangular outer shape, the semiconductor laser element 12 and the light reflecting member 13 are arranged such that the direction of the optical axis of the light reflected by the light reflecting member 13 differs from a direction that is perpendicular to the lower surface of the base member 11. In other words, the semiconductor laser element 12 and the light reflecting member 13 are arranged such that the optical axis of the light reflected by the light reflecting member 13 approaches a plane extending through an inner surface of the base member that is a side of one of long sides of the rectangular outer shape. With this configuration, the semiconductor laser device 10 does not need to be mounted with an inclination, so that mounting of the semiconductor laser device 10 can be facilitated, and light emitted from the semiconductor laser device 10 can be accurately incident on the portion of the light reflecting surface of the light guide plate that is in the vicinity of the light incident surface of the light guide plate.

For the simplicity of explanation, in the present specification, the lower side in the cross-sectional views shown in FIG. 1, FIG. 4, FIG. 7, and FIG. 10 is described as "lower", and the upper side in the cross-sectional views shown in FIG. 1, FIG. 4, FIG. 7, and FIG. 10 is described as "upper". These positional relationships are sufficient in relative magnitudes, and thus, for example, even if each figure is turned upside down, still falls within the scope of the present invention.

Main components used in the light emitting device 10 will be described below.

Base Member 11

The base member 11 has the recess that opens upward. The semiconductor laser element 12, the light reflecting member 13, or the like are disposed on the bottom surface of the recess. The base member 11 can have any appropriate shape, but preferably have a substantially rectangular outer shape having two short sides and two long sides in a top view. With this configuration, a thin-type semiconductor laser device can be obtained. In the present specification, the expression "the semiconductor laser device is thin" refers to a thickness of the semiconductor laser device that is combined with a light guide plate, and more specifically, refers to that the length of the short side of the semiconductor laser device shown in FIG. 2 is small.

Examples of the materials for the base member 11 include insulating ceramics such as AlN, alumina, and SiC; metals such as CuW, Cu, Al, and Fe; and alloys thereof. In the case where the base material 11 contains a metal, it is preferable that the bottom surface of the recess of the base member 11 is made of insulating ceramics. With such material, a difference in the thermal expansion between the base member 11 and the semiconductor laser element 12 can be small, which allows the semiconductor laser element 12 to be mounted directly on the base member 11, so that the semiconductor laser device can be made small. In the present embodiment, the bottom surface of the recess of the base member 11 is flat, but the bottom surface may include a portion having an inclination or a step, as appropriate.

The base member 11 can have a cross-sectional thickness at the bottom of the recess (i.e., a thickness between the bottom surface of the recess of the base member and the lower surface of the base member 11) preferably in a range of 50 μm to 2000 μm, and more preferably in a range of 100 μm to 500 μm. A thickness of 50 μm or greater allows for a reduction in the occurrence of breakage of the base member 11 due to a difference between the thermal expansion coefficient of semiconductor laser element 12 or the like and the thermal expansion coefficient of the base member 11. A thickness of 2000 μm or less allows for a reducing degradation of heat dissipation performance of the base member 11 when heat is dissipated from a lower surface of the base member 11.

The recess of the base member 11 is defined by lateral walls 11a. In this case, the semiconductor laser element 12 and the light reflecting member 13 are disposed on the inner side of the lateral walls 11a. One or more of the lateral walls 11a preferably has a height (that is, a height from the bottom surface of the recess to an upper surface of the lateral wall 11a (an upper surface of the base member 11)) preferably in a range of 200 μm to 2000 μm, more preferably in a range of 400 μm to 1000 μm, and even more preferably in a range of 500 μm to 900 μm. With the height of the smallest value or greater in the range of the height described above, contact between the semiconductor laser element 12 or a wire, which electrically connects the semiconductor laser element 12 and the base member 11, and a component disposed on the upper surface of the base member 11 such as the light transmissive member can be avoided. Meanwhile, with the height of the highest value or smaller in the range of the height described above, light from the semiconductor laser element 12 that is reflected by the light reflecting member 13 and incident on the lateral walls 11a can be reduced.

In the present embodiment, an electrical wiring is arranged on the lower surface of the base member 11 so that the lower surface of the base member 11 can serve as a heat radiation surface. The electrical wiring arranged on the lower surface of the base member 11 is extended through the base member 11 to also be arranged on the inner side of the recess of the base member 11, and the electrical wiring arranged on the inner side of the recess is electrically connected to the semiconductor laser element 12. Alternatively, for example, the electrical wiring that electrically connects the semiconductor laser element 12 and the base member 11 on the inner side of the recess of the base member 11 is extended to also be arranged on an outer lateral surface of the lateral wall 11a (a lateral surface of the base member 11), which allows the lateral surface of the base member to serve as a mounting surface of the semiconductor device and to serve as the heat radiation surface.

In certain embodiments, a material having light-shielding property is used for the lateral walls 11a of the base member, but in other embodiments, a light-transmissive material such as glass may also be used for the lateral walls 11a. Forming the lateral walls 11a with a light-transmissive material allows for a reduction in light emitted from the semiconductor laser element 12 that is blocked by the lateral walls 11a, which can improve light extraction efficiency of the semiconductor laser device.

Semiconductor Laser Element 12

The semiconductor laser element 12 is mounted on the bottom surface of the recess of the base member 11 so as to emit light laterally. That is, the semiconductor laser element 12 is mounted so that a light emitting surface side of the semiconductor laser element 12 is perpendicular to the bottom surface of the recess and faces the reflecting surface 13a of the light reflecting surface side. With this arrangement, heat generated in the semiconductor laser element can be efficiently transferred to the base member 11. For the semiconductor laser element 12, various semiconductor laser diodes such as GaN-based or GaAs-based semiconductor laser diodes can be used.

The semiconductor laser element 12 may be disposed directly on the bottom surface of the recess of the base member 11, or may be disposed on the bottom surface of the recess of the base member 11 via a submount. With the submount having a thermal expansion coefficient between that of the semiconductor laser element 12 and that of the base member 11, stress that is generated between the semiconductor laser element 12 and the base member 11, due to different degree of expansion when the semiconductor laser element 12 generates heat, can be reduced, and also heat generated by the semiconductor laser element 12 can be released to the submount, so that sufficient heat dissipation can be maintained. Examples of the materials for the submount include aluminium nitride, silicon carbide, and silicon. The semiconductor laser element 12 can be mounted on the base member 11 or the submount via an adhesive member. As the adhesive material, for example, a metal material containing such as Au, Ag, Sn, Ni or the like can be used.

Light Reflecting Member 13

The light reflecting member 13 is disposed forward of the light emitting surface of the semiconductor laser element 12, and includes a light reflecting surface 13a configured to reflect light emitted from the semiconductor laser element 12. In the present embodiment, the light reflecting surface 13a of the light reflecting member 13a is arranged so that laser light emitted from the semiconductor laser element 12 is reflected in a direction other than the direction perpendicular to the light emitting surface of the semiconductor laser device 10. In other words, in a top view of the semiconductor laser device 10, the light reflecting member 13 is arranged such that one of the sides of the outermost periphery of the semiconductor laser element 12, which corresponds to the upper edge of the light emitting surface of the semiconductor laser element and is closest to the light reflecting surface 13a, and one of sides that form the outermost periphery of the light reflecting surface 13a, which is closest to the semiconductor laser element 12, are not parallel to each other. With this arrangement, light emitted from the semiconductor laser device 10 can be inclined without arranging the light emitting surface of the semiconductor laser device 10 at an angle with respect to the light incident surface of the light guide plate.

The light reflecting surface 13a is made of a single substantially flat surface. Of the sides of the outer periphery of the light reflecting surface 13a, the side proximate to the bottom surface of the recess and parallel with the bottom surface of the recess (which may be referred to as the "lower side of the light reflecting surface" in the description below) is, in a plan view, inclined with respect to the line corresponding to the upper edge of the light emitting surface of the semiconductor laser element 12 (that is, a line in parallel with a short side of the rectangular outer shape). The inclination angle of the light reflecting surface 13a can be preferably in a range of 3° to 60°, more preferably in a range of 5° to 45°, and even more preferably in a range of 10° to 30°. With an angle of 3° or more, irradiation of the laser light emitted from the semiconductor laser device on the a light reflecting surface of the light guide plate 52 can be facilitated, and with an angle of 60° or less, an amount of light such as the light that is reflected away from the light guide plate 52 at the time of irradiation and/or waveguide loss in the light guide plate 52 can be reduced. The light reflecting member 13 is mounted on the bottom surface of the recess with the lower surface of the light reflecting member. The lower surface of the light reflecting member and the light reflecting surface 13a form an angle (i.e., an inclination angle), for example, preferably in a range of 15° to 75°, more preferably in a range of 30° to 60°, and even more preferably in a range of 40° to 50°.

Examples of the materials for the light reflecting member 13 include an optical grass made of synthetic quartz or the like with a light reflecting film disposed on a portion where laser light to be irradiated. Synthetic quartz has good heat resistance, so that deterioration of the light reflecting member 13 can be reduced even when the light reflecting film is heated by the laser light. For the light reflecting film, for example, a metal film such as a silver film, an aluminum film, or a gold film, or a dielectric multilayer film in which oxide films such as silicon dioxide, titanium dioxide, tantalum pentoxide, zirconium dioxide, or niobium pentoxide are layered can be used. The light reflecting member 13 may have an appropriate shape, but it is preferable to have a shape in which an upper surface of the light reflecting member 13 is a flat surface (for example, an approximately trapezoidal shape as shown in FIG. 1 or the like). With this arrangement, the upper surface of the light reflecting member 13 can be used as a pick-up surface, so that handling of the light reflecting member 13 can be facilitated. Further, the upper surface of the light reflecting member 13 can be used as a recognition surface at the time of mounting the semiconductor laser element or the like, so that a positional error in mounting of the semiconductor laser element 12 or the like can be reduced.

Light-Transmissive Member 15

The light-transmissive member 15 can be arranged on the upper surfaces of the lateral walls 11a. For the light-transmissive member 15, a material such as glass, ceramics or the like can be used. The light-transmissive member 15 may have any appropriate shape. In the present embodiment, an upper surface of the light-transmissive member 15 is in parallel with the lower surface of the base member 11. In the semiconductor laser device 10, the semiconductor laser element 12 and the light reflecting member 13 are arranged such that a direction of the optical axis of light that is reflected by the light reflecting member 13 is different from a direction that is perpendicular to the lower surface of the base member 15.

In the case where the light-transmissive member 15 is disposed on the upper surfaces of the lateral walls 11a, it is preferable to use the light-transmissive member 15 whose outermost periphery is smaller than an outermost periphery of the lateral walls 11a. With this arrangement, even if a positional error occurs at the time of mounting the light-transmissive member 15, the outermost periphery of the light transmissive member 15 hardly protrudes from the outermost periphery of the lateral wall 11a, so that the dimensional accuracy of the semiconductor laser device 10 can be improved, and handling of the semiconductor laser device 10 can be facilitated.

Other Components

In order to suppress electrical destruction of the semiconductor laser element 12, a protective element 14 such as a Zener diode can be mounted on the bottom surface of the recess of the base member 11. In a top view, the protective element 14 is preferably disposed on an extension of an imaginary line connecting the semiconductor laser element 12 and the light reflecting member 13 (i.e., on a plane extending through the semiconductor laser element 12 and the light reflecting member 13), and preferably, can be disposed at an opposite side to the semiconductor laser element 12 with respect to the light reflecting member 13. Accordingly, the light reflecting member 13 can be disposed in the vicinity of the center of the semiconductor laser device 10, so that the amount of light reflected by the reflecting surface 13a and incident on the lateral walls 11a can be reduced, which allows for efficient extraction of light, and the semiconductor laser device 10 can have a reduced width in a top view (i.e. a thin semiconductor laser device can be realized.).

As shown in FIG. 2, in a top view, the semiconductor laser device 10 preferably has a rectangular shape (more specifically, rectangular peripheral shape) having two long sides and two short sides, and the optical axis of laser light emitted from the semiconductor laser element 12 can be in parallel to long sides of the rectangular shape. With this configuration, a thin and small semiconductor laser device 10 can be realized. In the case where the semiconductor laser device 10 has a rectangular shape in a top view, the ratio of the length of the short side to the long side can be preferably in a range of 1:1.5 to 1:3.5, more preferably in a range of 1:2 to 1:3, and further preferably in a range of 1:2 to 1:2.5. With the ratio of 1:3.5 or less, a thin semiconductor laser device 10 can be obtained, and with the ratio of 1:1.5 or greater, manufacturing of the semiconductor laser device can be facilitated. More specifically, for example, the length of the short side of the semiconductor laser device 10 can be preferably in a range of 0.8 mm to 3 mm, more preferably in a range of 1 mm to 2.5 mm, and further preferably in a range of 1.2 mm to 2 mm. In this case, the height of the semiconductor laser device 10 can be preferably in a range of 1 mm to 5 mm, more preferably in a range of 1.2 mm to 4.5 mm, and further preferably 1.5 mm to 4 mm.

Second Embodiment

Figure 4:
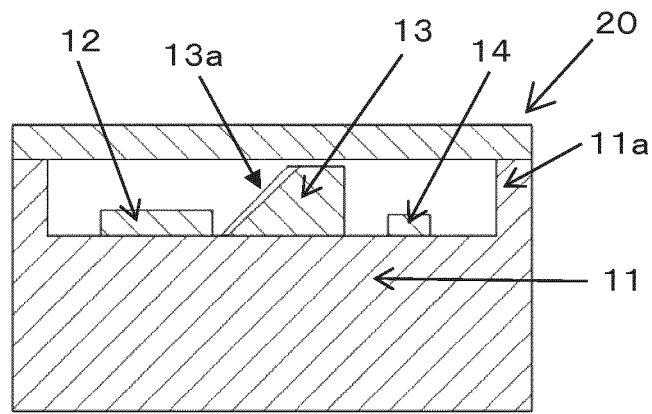
FIG. 4 is a schematic cross-sectional view of a semiconductor laser device according to a second embodiment.
Figure 5:
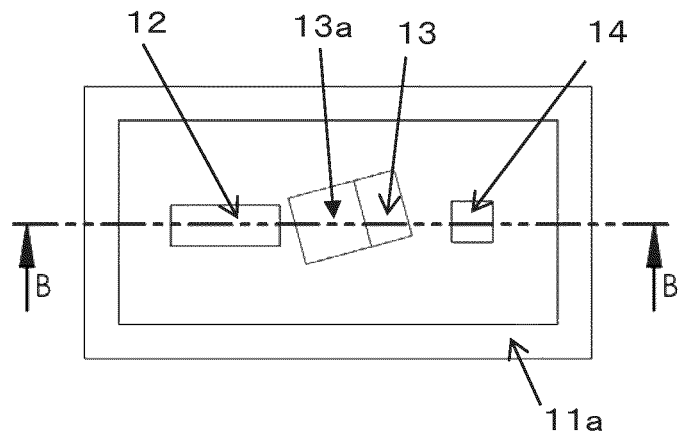
FIG. 5 is a schematic plan view of the semiconductor laser device shown in FIG. 4 seen from the light emitting surface side.
Figure 6:
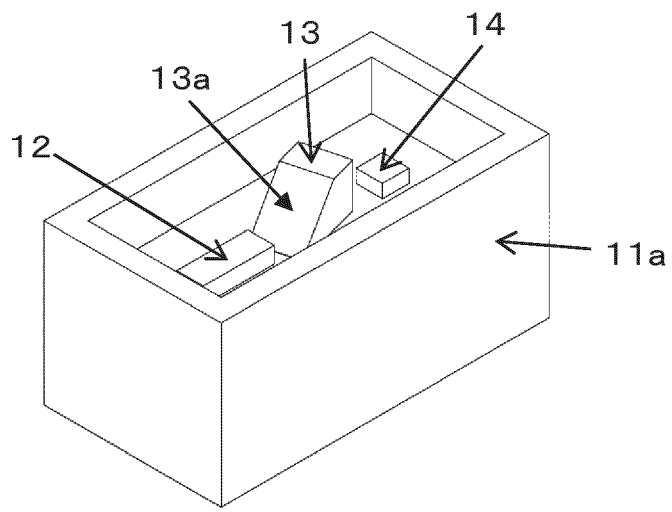
FIG. 6 is a schematic perspective view of the semiconductor laser device shown in FIG. 4.

FIG. 4 to FIG. 6 illustrate a semiconductor laser device 20 according to a second embodiment of the present disclosure. FIG. 4 is a schematic cross-sectional view of the semiconductor laser device 20 (a schematic cross-sectional view taken along line B-B of FIG. 5), FIG. 5 is a schematic plan view of the semiconductor laser device 20 seen from an upper surface side (the light emitting surface side), and FIG. 6 is a schematic perspective view of the semiconductor laser device 20. In FIG. 5 and FIG. 6, a light transmissive member 15 is not shown for easy understanding of the structure.

The semiconductor laser device 20 is different from the semiconductor laser device 10 according to the first embodiment in that the light reflecting member 13 includes a lower surface and a light reflecting surface 13a having an inclination angle of 45 relative to the lower surface, and a light reflecting member is arranged rotated by a predetermined angle on a bottom surface of a recess of the base member 11 so that a direction of an optical axis of light reflected by the light reflecting member 13 differs from a direction perpendicular to the lower surface of the base member 11.

In other words, in a top view of the second embodiment, a semiconductor laser element 12 is arranged such that an optical axis of light emitted from a semiconductor laser element 12 is in parallel with the two long sides of rectangular shape of a base member 11. Further, the light reflecting member 13 that includes a lower surface and a light reflecting surface 13a having an inclination angle of 45° relative to the lower surface is arranged such that, in a top view, a side at a lower periphery of a light reflecting surface 13a is at an angle with respect to with respect to a side that is an upper edge of a light emitting surface of the semiconductor laser element 12. According to the second embodiment, processing of the light reflecting member 13 can be facilitated.

Figure 16:
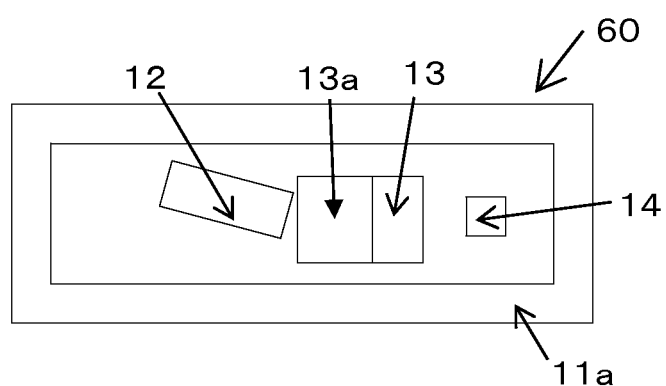
FIG. 16 is a schematic plan view of a semiconductor laser device according to one embodiment.
Figure 17:
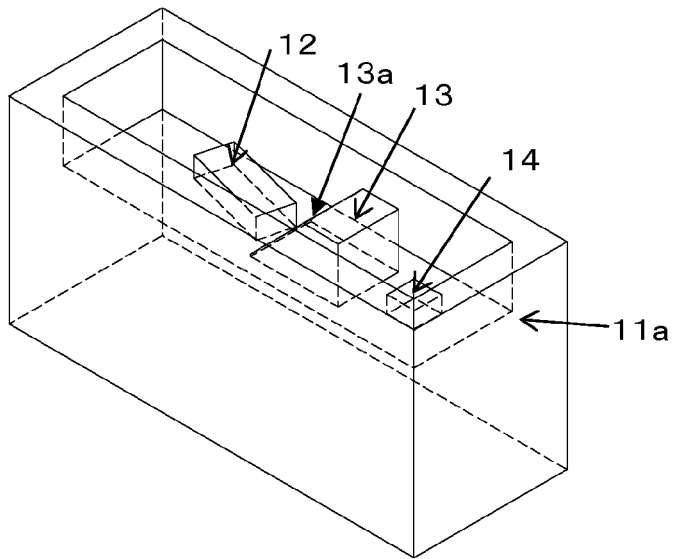
FIG. 17 is a schematic perspective view of the semiconductor laser device shown in FIG. 16.

In the second embodiment, the light reflecting member 13 is rotated and arranged such that the light reflecting surface 13a faces in a predetermined direction. As shown, for example, in a top view in FIG. 5, while two lateral surfaces of the semiconductor laser element 12 (surfaces that are in parallel with each other and are perpendicular to the light emitting surface, the light reflecting surface of the semiconductor laser element 12 and the bottom surface of the recess of the base member 11) and inner surfaces of lateral walls of the base member 11 that correspond to long sides of the rectangular shape are in parallel. Further, two lateral surfaces of the light reflecting member 13 (surfaces that are in parallel with each other and are perpendicular to the bottom surface of the recess) and the inner surfaces of lateral walls of the base member 11 that correspond to the long sides of the rectangular shape are not in parallel. However, as shown in FIG. 16 and FIG. 17, it is also possible to employ a configuration in which the two lateral surfaces of the semiconductor laser element 12 and the inner surfaces of the lateral walls that corresponds to long sides of the rectangular shape are not in parallel, while the two lateral surfaces of the light reflecting member 13 and the inner surfaces of lateral walls that correspond to long sides of the rectangular shape are in parallel. Even in this case, effects similar to that obtained in the present embodiment can be exhibited.

Third Embodiment

Figure 7:
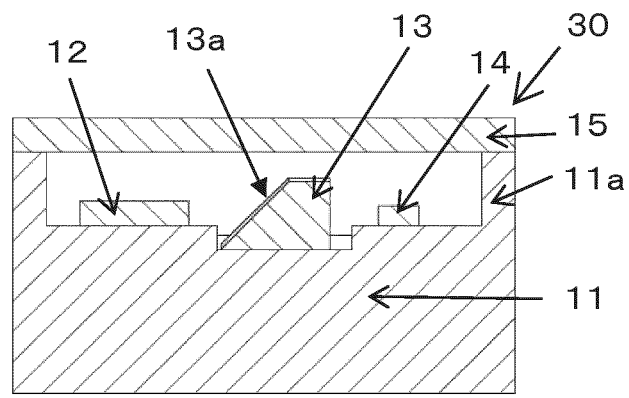
FIG. 7 is a schematic cross-sectional view of a semiconductor laser device according to a third embodiment.
Figure 8:
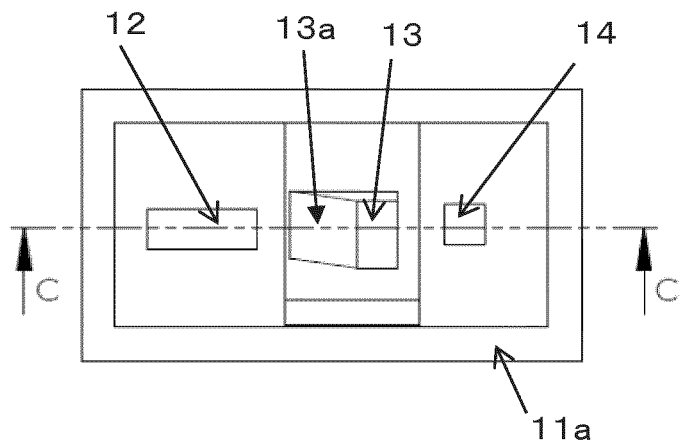
FIG. 8 is a schematic plan view of the semiconductor laser device shown in FIG. 7 seen from the light emitting surface side.
Figure 9:
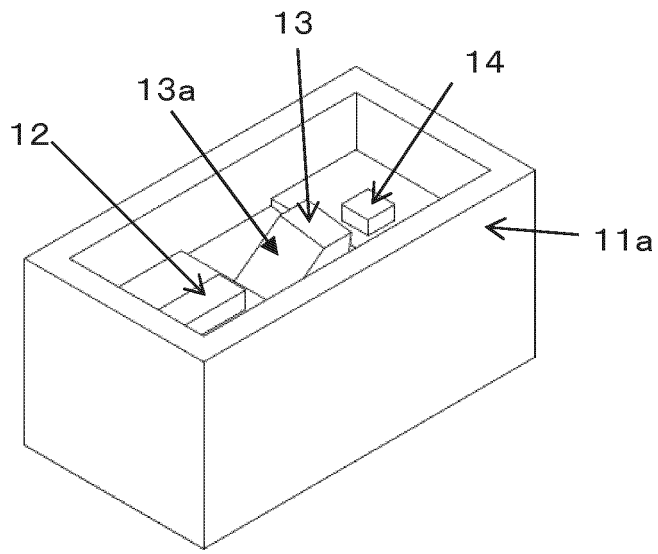
FIG. 9 is a schematic perspective view of the semiconductor laser device shown in FIG. 7.

FIG. 7 to FIG. 9 illustrate a semiconductor laser device 30 according to a third embodiment. FIG. 7 is a schematic cross-sectional view of the semiconductor laser device 30 (a schematic cross-sectional view taken along line C-C of FIG. 8), FIG. 8 is a schematic plan view of the semiconductor laser device 30 seen from an upper surface side (the light emitting surface side), and FIG. 9 is a schematic perspective view of the semiconductor laser device 30. In FIG. 8 and FIG. 9, a light transmissive member 15 is not shown for easy understanding of the structure.

The semiconductor laser device 30 is different from the semiconductor laser device 10 of the first embodiment in that a second recess is formed in the recess of the base member 11 and a the light reflecting member 13 is disposed on the bottom surface of the second recess; the bottom surface of the second recess is inclined with respect to the lower surface of the base member 11; and in a top view, a side at a lower periphery of the light reflecting surface 13a is in parallel to the line corresponding to the upper edge of the light emitting surface of the semiconductor laser element 12. That is, in the semiconductor laser device 30, only the bottom surface of the second recess of the base member 11, on which a light reflecting member 13 is disposed, is inclined with respect to the bottom surface of the recess of the base member 11.

According to the third embodiment, the light reflecting member 13 can be formed more easily. Further, a portion of the bottom surface of the recess of the base member 11 on which a semiconductor laser element 12 is mounted is not inclined, so that the semiconductor laser element 12 can be mounted more easily. In the example shown in the third embodiment, the bottom surface of the second recess of the base member 11 is partially inclined, but alternatively, a step portion having an upper step and a lower step may be formed in the second recess and the light reflecting member 13 may be arranged in contact with both the upper step and the lower step. That is, the base member 13 may be arranged such that the bottom surface of the base member 13 is in contact with an edge portion of the upper step and an edge portion of the lower step to incline the light reflecting surface 13a of the light reflecting member 13.

Fourth Embodiment

Figure 10:
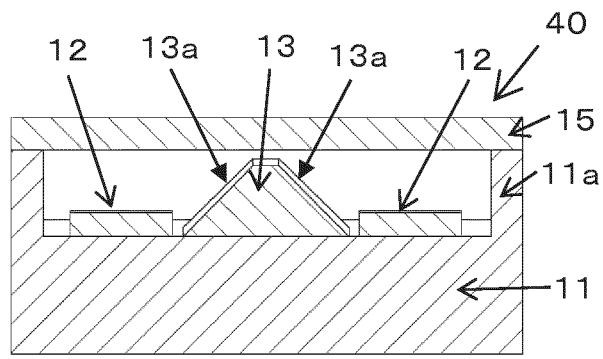
FIG. 10 is a schematic cross-sectional view of a semiconductor laser device according to a fourth embodiment.
Figure 11:
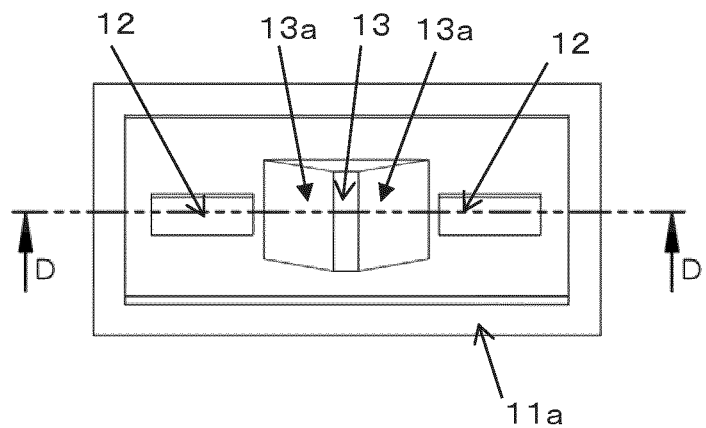
FIG. 11 is a schematic plan view of the semiconductor laser device shown in FIG. 10 seen from the light emitting surface side.
Figure 12:
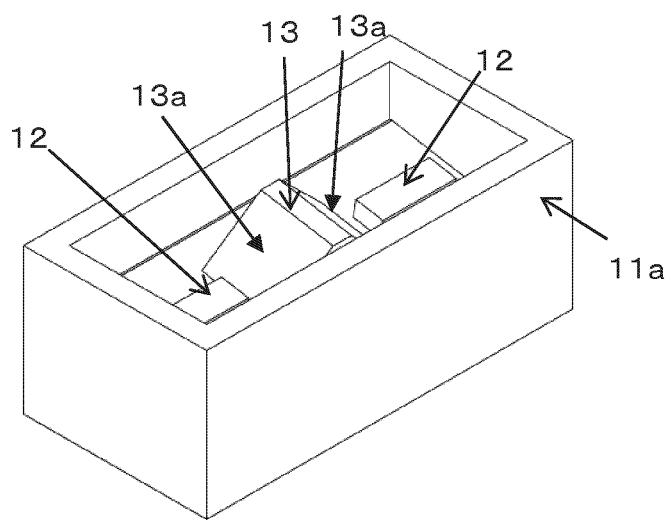
FIG. 12 is a schematic perspective view of the semiconductor laser device shown in FIG. 10.

FIG. 10 to FIG. 12 illustrate a semiconductor laser device 40 according to a fourth embodiment. FIG. 10 is a schematic cross-sectional view of the semiconductor laser device 40 (a schematic cross-sectional view taken along line D-D of FIG. 11), FIG. 11 is a schematic plan view of the semiconductor laser device 40 seen from an upper surface side, and FIG. 12 is a schematic perspective view of the semiconductor laser device 40. In FIG. 11 and FIG. 12, a light transmissive member 15 is not shown for easy understanding of the structure.

The semiconductor laser device 40 is different from the semiconductor laser device 30 according to the third embodiment in that a plurality of the semiconductor laser elements 12 are disposed on the bottom surface of the recess of the base member 11; a light reflecting surface 13 are arranged so as to corresponds to each of the plurality of semiconductor laser elements 12; and in addition to the portion of the recess of the base member 11 on which the light reflecting member 20, a portion of the bottom surface of the recess of the base member 11 on which the semiconductor laser element 12 is disposed is also inclined with respect to the lower surface of the base member 11. That is, in the semiconductor laser device 40 according to the fourth embodiment, a plurality of semiconductor laser elements 12 are disposed on a bottom surface of a recess of a base member 11 with a light reflecting member 13 that is disposed between the semiconductor laser elements 12. Further, a substantially whole bottom surface of the recess of the base member 11 is inclined, so that the portions of the bottom surface of the recess on which the light reflecting member 13 is disposed and on which the semiconductor laser element 12 is disposed are both inclined with respect to the lower surface of the base member 11. In the example shown in the fourth embodiment, the substantially whole bottom surface of the recess of the base member 11 is inclined, but alternatively, it is also possible to incline only the portion on which the semiconductor laser element 12 is disposed and the portion on which the light reflecting member 13 is disposed.

According to the fourth embodiment, a light reflecting surface 13a of the light reflecting member 13 and the semiconductor laser element 12 are both inclined, which can facilitate adjustment of the beam shape of the laser light irradiated from the semiconductor laser device. In other words, the major axis of an elliptic laser beam shape of the laser light emitted from the semiconductor laser device can be aligned with a long side of the semiconductor laser device.

In the case of providing a step on the portion of the bottom surface of the recess of the base member 11 on which the semiconductor laser element 12 is disposed so as to rotate the angular orientation of the light reflecting surface 13a of the light reflecting member 13 relative to the orientation of the light emitting surface of the semiconductor laser element, a bonding member can be arranged between the mounting surface (lower surface) of the semiconductor laser element 12 and the step of the base member 11. With this configuration, space between the semiconductor laser element 12 and the base member 11 can be filled, so that mechanical strength can be improved and the thermal connection between the semiconductor laser element 12 and the base member 11 can be obtained, allowing for a reducing degradation of the heat dissipating performance of the semiconductor laser element 12. For the bonding member, eutectic solder or the like can be used.

Fifth Embodiment

Figure 18:
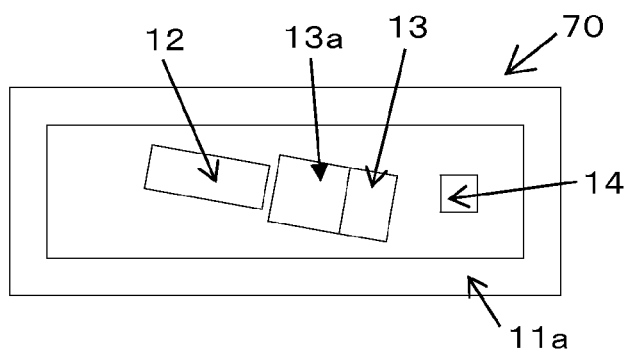
FIG. 18 is a schematic plan view of a semiconductor laser device according to a fifth embodiment.
Figure 19:
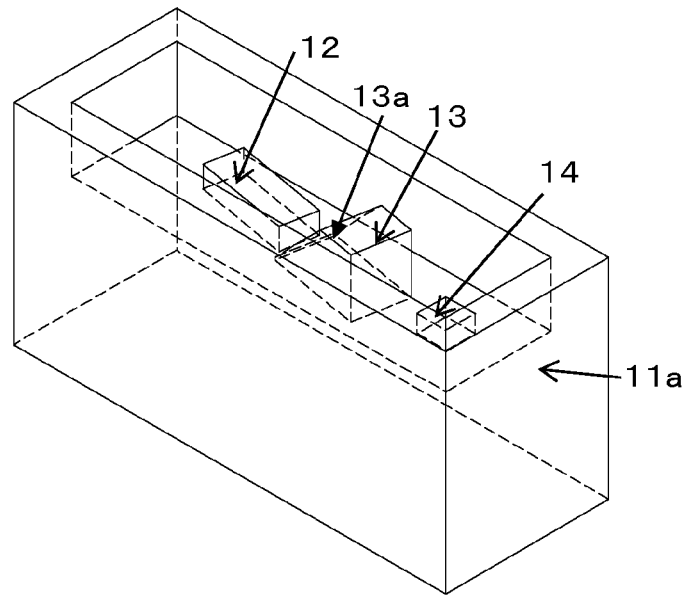
FIG. 19 is a schematic perspective view of the semiconductor laser device shown in FIG. 18.

FIG. 18 to FIG. 19 illustrate a semiconductor laser device 70 according to a fifth embodiment. FIG. 18 is a schematic plan view of the semiconductor laser device 70 shown in FIG. 18 seen from an upper surface side thereof, and FIG. 19 is a schematic perspective view of the semiconductor laser device 70.

In a top view of the semiconductor laser device 70, a semiconductor laser element 12 is arranged such that an optical axis of light emitted from a semiconductor laser element 12 is not in parallel with a long side of a peripheral shape of a base member 11. That is, two lateral surfaces of the long sides of the semiconductor laser element 12 are not in parallel with two inner surfaces of the long sides of lateral walls 11a of the base member 11. Moreover, in the fifth embodiment, in a top view, a light reflecting member 13 is arranged such that a lower side of a light reflecting surface 13a is in parallel with respect to the line that corresponds to the upper edge of the light emitting surface of the semiconductor laser element 12. Further, the light reflecting surface 13a and a lower surface of the light reflecting member 13 forms an angle in a range of 30 to 60 (not including 45). Also in the fifth embodiment, an optical axis of light reflected by the light reflecting surface 13a can be directed in a direction other than a direction perpendicular to the lower surface of the base member 11.

Sixth Embodiment

Figure 13:
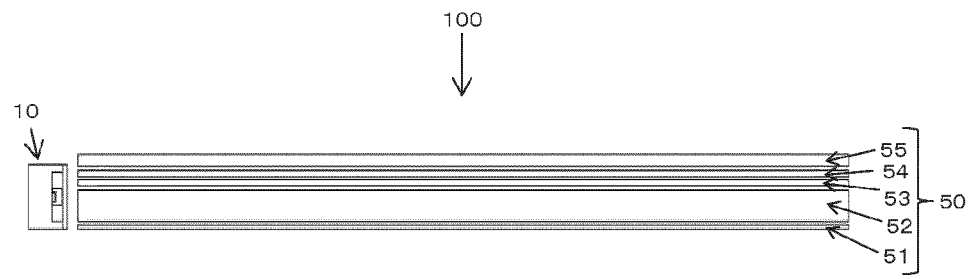
FIG. 13 is a schematic view of a backlight device according to a sixth embodiment.
Figure 14:
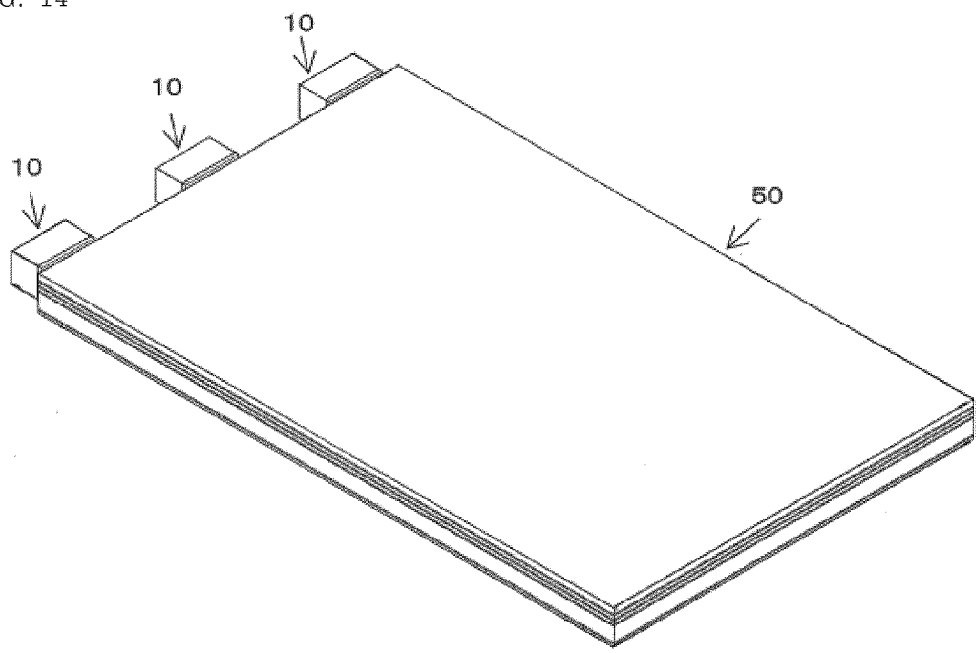
FIG. 14 is a schematic perspective view of the backlight device shown in FIG. 13.
Figure 15:
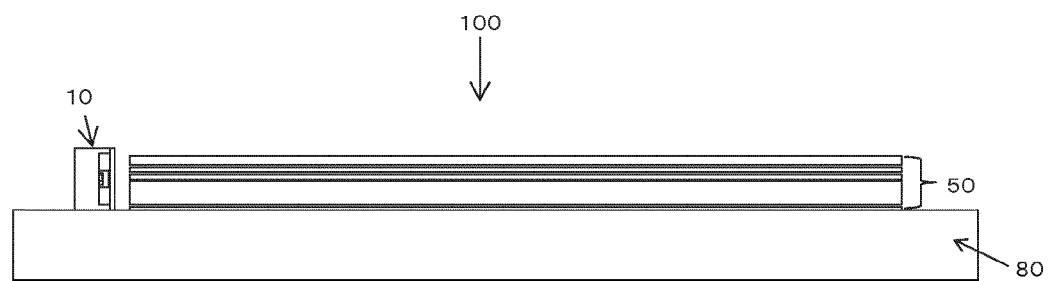
FIG. 15 is a schematic view of a backlight device according to one embodiment.

FIG. 13 and FIG. 14 illustrate a backlight device 100 according to a sixth embodiment. FIG. 13 is a schematic view of the backlight device 100, and FIG. 14 is a schematic perspective view of the backlight device 100. The backlight device 100 includes a semiconductor laser device according to any of the first embodiment to the fifth embodiment as described above and a light guide plate 52 that is disposed above the base member 11 of the semiconductor laser device. For the simplicity of explanation, the semiconductor laser device 10 is used for illustrating the present embodiment. The light guide plate 52 is arranged so as to allow a laser light emitted from the semiconductor laser device to be incident on the light guide plate. Also, a light incident surface of the light guide plate 52 may be inclined with respect to a plane perpendicular to an upper surface and/or a lower surface of the light guide plate 52 so as to introduce light from the semiconductor laser device on the light incident surface. In FIG. 13 and FIG. 14, the semiconductor laser device is arranged so that a direction along the short-side of the base member 11 corresponds to a thickness direction of an optical member included in the light guide plate.

In the sixth embodiment, the semiconductor laser device 10 is arranged so that a laser light is emitted at angle from the semiconductor laser device 10 and is incident on the light guide plate 52 to promote incidence of laser light on a light reflecting surface of the light guide plate 52

Optical Member 50

The optical member 50 includes the light guide plate 52 for surface-emitting the light from the semiconductor laser device 10. The light guide plate 52 includes at least a light extracting surface (an upper surface of the light guide plate 52 in FIG. 13), a light reflecting surface (a lower surface of the light guide plate 52 in FIG. 13), and four lateral surfaces connecting these surfaces. Of the four lateral surfaces, a surface that faces the semiconductor laser device 10 serves as a light incident surface. The semiconductor laser device 10 is arranged on one lateral surface side of the optical member 50, and light emitted from the semiconductor laser device 10 is incident on one lateral surface of the light guide plate 52. Further, light emitted from the semiconductor laser device 10 advances to the light reflecting surface of the light guide plate 52. With this configuration, light emitted from the semiconductor laser device 10 can accurately be incident on the light reflecting surface of the light guide plate 52 and then extracted. Further, a processing can be performed on the reflecting surface of the light guide 52 to produce minute unevenness on the surface. With this, light advancing toward the light reflecting surface of the light guide plate 52 can be reflected to the upper surface of the light guide plate 52 and extracted.

The optical member 50 and the semiconductor laser device 10 are arranged so that a minimum distance between a light incident surface of the optical member 50 and the semiconductor laser device 10 is preferably in a range of 0 mm to 2 mm, and more preferably 0.01 mm to 1 mm. A distance of 0 mm or greater facilitates a laser light emitted from the semiconductor laser device 10 to be incident on a portion of a light reflecting surface of the light guide plate 52 in the vicinity of the light incident surface, and a distance of 2 mm or less can reduce a light diffusion of the laser light. In the case where the semiconductor laser device has a rectangular shape when seen from the light emitting surface side, the semiconductor laser device is arranged such that a long side of the rectangular shape can be parallel to the light extracting surface of the light guide plate 52. With this configuration, optical loss can be reduced and a thin backlight device can be realized.

In the case where the semiconductor laser device has a rectangular shape when seen from the light emitting surface side, the optical member 50 preferably has a height (a height between a lower surface and upper surface of the optical member 50 in FIG. 13) that is smaller than a short side of the rectangular shape. For example, the height of the optical member 50 can be in a range of 0.5 mm and 1.5 mm. In a case where conventional components are employed, in which an optical member has a small height to make the optical member be thin and a semiconductor laser device and an optical member are arranged on a same surface of a support member, light emitted from the semiconductor laser device is less easily be incident on an entirety of a light reflecting surface of a light guide plate, which may lead to a reduction in light extracting efficiency of a backlight device. In contrast, a configuration according to certain embodiments of the present disclosure, an optical axis of light reflected by the light reflecting surface 13a of the light reflecting member 13 is emitted in a direction different from a direction perpendicular to the lower surface of the base member 11 of the semiconductor device. That is, light can be emitted from the semiconductor laser device in a direction that is inclined with respect to the light emitting surface of the semiconductor laser device 10. Accordingly, even in a case where the optical member 50 has a small height, light emitted from the semiconductor laser device can easily be incident on approximately an entirety of the light reflecting surface of the light guide plate 52, so that decrease in light extracting efficiency of the backlight device 100 can be reduced.

In the case where a mounting surface of the semiconductor laser device 10 and a mounting surface of the optical member 30 are on a same plane, it is preferable that an optical axis of light emitted from the semiconductor laser device 10 and a lower surface of the light guide plate form an angle in a range of 5° to 30°, and more preferably in a range of 10° to 15°. With an angle of 5° or more, the optical member 30 and the semiconductor laser device 10 can be arranged close to each other. With an angle of 30° or less, irradiation of the light emitted from the semiconductor laser device 10 on approximately an entirety of the light reflecting surface of the light guide plate 52 can be facilitated.

The optical member 50 can include a light reflecting plate 51. The light reflecting plate 51 is arranged on a light reflecting surface side of the light guide plate 52, and serves to reflect light emitted downwardly from the light reflecting surface of the light guide plate 52 (i.e. light leaked from the light guide plate 52) to the light guide plate 52. With this arrangement, such light can be efficiently extracted.

The optical member 50 can also include a light diffusing sheet 53. The light diffusing sheet 53 is arranged on an upper surface side of the light guide plate 52, and serves to diffuse light emitted from the light guide plate 52. Although a light emitted from the semiconductor laser device has a strong directivity, with the use of the light diffusing sheet 53, light guided through the light guide plate 52 can be emitted more uniformly from the optical member 50. Further, a prism sheet 54 that serves to change the direction of light emitted from the light diffusing sheet 53 toward an upper surface, and/or a polarizing plate 55 that serve to selectively transmit only desired polarized component.

Although the semiconductor laser device 10 is illustrated in FIG. 13 and FIG. 14 as a semiconductor laser device, the semiconductor device described in any of the second embodiment to the fourth embodiment can also be used.

The semiconductor laser device in each embodiment can be utilized in various devices such as optical discs, optical communication systems, projectors, displays, printing machines, and measuring instruments, as well as backlight devices.

10, 20, 30, 40, 60, 70 semiconductor laser device
11 base member
11a lateral wall
12 semiconductor laser element
13 light reflecting member
13a light reflecting surface
14 protective element
26 light-transmissive member
100 backlight device
50 optical member
51 light reflecting plate
52 light guide plate
53 light diffusing sheet
54 prism sheet
55 polarizing plate
80 support member

What is claimed is:

1. A semiconductor laser device comprising:
a base member having a recess that opens upward,
a semiconductor laser element disposed on a bottom surface of the recess, and
a light reflecting member disposed on the bottom surface of the recess and configured to reflect laser light emitted from the semiconductor laser element;
wherein the semiconductor laser element and the light reflecting member are arranged such that a direction of an optical axis of a laser light that is reflected by the light reflecting member differs from a direction perpendicular to a lower surface of the base member.

2. The semiconductor laser device according to claim 1, wherein, in a top view, the base member has a substantially rectangular outer shape that has a short side and a long side, and
wherein, when seen from a lateral side corresponding to the short side of the substantially rectangular outer shape, the optical axis of the light reflected by the light reflecting member approaches a plane extending through an inner surface of the base member that corresponds to the long side of the rectangular outer shape.

3. The semiconductor laser device according to claim 2, wherein, in the top view, a semiconductor laser element is arranged such that the optical axis of the laser light emitted from the semiconductor laser element is parallel with each of two long sides of the substantially rectangular shape.

4. The semiconductor laser device according to claim 2, wherein, in the top view, the light reflecting member is arranged such that one side of an outermost periphery of the semiconductor laser element that corresponds to an upper edge of a light emitting surface of the semiconductor laser element is closest to the light reflecting member, and one side of an outermost periphery of the light reflecting member that is closest to the semiconductor laser element, are not parallel to each other.

5. The semiconductor laser device according to claim 3, wherein, in the top view, the light reflecting member is arranged such that one side of an outermost periphery of the semiconductor laser element that corresponds to an upper edge of a light emitting surface of the semiconductor laser element and is closest to the light reflecting member, and one side of an outermost periphery of the light reflecting member that is closest to the semiconductor laser element, are not parallel to each other.

6. The semiconductor laser device according to claim 4, wherein said one side of the outermost periphery of the semiconductor laser element is inclined with respect to said one side of the outermost periphery of the light reflecting member at an angle in a range of 3° to 60°.

7. The semiconductor laser device according to claim 5, wherein said one side of the outermost periphery of the semiconductor laser element is inclined with respect to said one side of the outermost periphery of the light reflecting member at an angle in a range of 3° to 60°.

8. The semiconductor laser device according to claim 2, wherein, in the top view, a protective element is disposed in a plane extending through the semiconductor laser element and the light reflecting member.

9. The semiconductor laser device according to claim 6, wherein, in the top view, a protective element is disposed in plane extending through the semiconductor laser element and the light reflecting member.

10. The semiconductor laser device according to claim 1, wherein the light reflecting member is disposed on a portion of the bottom surface of the recess of the base member, and the portion on which the light reflecting member is disposed is inclined with respect to the lower surface of the base member.

11. The semiconductor laser device according to claim 2, wherein the light reflecting member is disposed on a portion of the bottom surface of the recess of the base member, and the portion on which the light reflecting member is disposed is inclined with respect to the lower surface of the base member.

12. The semiconductor laser device according to claim 1, wherein a plurality of the semiconductor laser elements are disposed on the bottom surface of the recess with a light reflecting member therebetween, the light reflecting member being disposed between the semiconductor laser elements.

13. The semiconductor laser device according to claim 3, wherein a plurality of the semiconductor laser elements are disposed on the bottom surface of the recess with a light reflecting member therebetween, the light reflecting member being disposed between the semiconductor laser elements.

14. A backlight device comprising:
the semiconductor laser device according to claim 1, and a light guide plate arranged above the base member.

15. A backlight device comprising:
the semiconductor laser device according to claim 4, and a light guide plate arranged above the base member.

16. A backlight device comprising:
the semiconductor laser device according to claim 7, and a light guide plate arranged above the base member.

17. The backlight device according to claim 15, wherein the semiconductor laser device and an optical member which includes the light guide plate are arranged on an upper surface of a support member, and a height of the optical member is smaller than a height of the semiconductor laser device.

18. The backlight device according to claim 14, wherein an optical axis of light emitted from the semiconductor laser device and a lower surface of the light guide plate form an angle in a range of 5 to 30.

19. The backlight device according to claim 15, wherein an optical axis of light emitted from the semiconductor laser device and a lower surface of the light guide plate form an angle in a range of 5 to 30.

20. The backlight device according to claim 17, wherein an optical axis of light emitted from the semiconductor laser device and a lower surface of the light guide plate form an angle in a range of 5 to 30.

* * * * *